United States Patent
Shimasaki

(10) Patent No.: US 6,876,231 B2
(45) Date of Patent: Apr. 5, 2005

(54) DRIVER CIRCUIT FOR USE IN PIN ELECTRONICS CARD

(75) Inventor: Noriaki Shimasaki, Tokyo (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 10/433,393

(22) PCT Filed: Dec. 5, 2001

(86) PCT No.: PCT/JP01/10646

§ 371 (c)(1),
(2), (4) Date: Jun. 2, 2003

(87) PCT Pub. No.: WO02/47268

PCT Pub. Date: Jun. 13, 2002

(65) Prior Publication Data

US 2004/0027165 A1 Feb. 12, 2004

(30) Foreign Application Priority Data

Dec. 5, 2000 (JP) .................................. 2000-370172

(51) Int. Cl.[7] ............................................. H03K 19/082
(52) U.S. Cl. ............................. 326/91; 326/86; 326/91; 326/33; 327/112; 327/111; 327/108
(58) Field of Search ............................. 326/91, 86, 33, 326/103, 30, 82; 327/112, 111, 108

(56) References Cited

U.S. PATENT DOCUMENTS

| | | | | |
|---|---|---|---|---|
| 5,206,544 A | * | 4/1993 | Chen et al. ................... | 326/86 |
| 5,654,655 A | * | 8/1997 | Awaji et al. ................. | 327/108 |
| 5,699,001 A | * | 12/1997 | Awaji et al. ................. | 327/112 |
| 5,745,003 A | * | 4/1998 | Wakimoto et al. .......... | 327/109 |

FOREIGN PATENT DOCUMENTS

| | | |
|---|---|---|
| JP | 8-166429 | 6/1996 |
| JP | 10-132898 | 5/1998 |

* cited by examiner

Primary Examiner—Michael Tokar
Assistant Examiner—Lam T. Mai
(74) Attorney, Agent, or Firm—Muramatsu & Associates

(57) ABSTRACT

A driver circuit for switching an output voltage (Vout) at an output terminal 3 by using diode bridges 1 and 2 includes a first current mirror circuit 10 for letting flow a first balance current $I_{2e}$ and letting flow a first transition current $I_{2f}$ obtained by adding a first stationary current to a product of the first balance current $I_{2e}$ and a predetermined multiplier when switching from the low level to the high level, and a second current mirror circuit 20 for letting flow a second transition current $I_{2h}$ obtained by adding a second stationary current to a product of the second balance current $I_{2g}$ and a predetermined multiplier when switching from the high level to the low level. As a result, the power dissipation in the stationary state is reduced without lowering the slew rate at the time when switching the output voltage.

1 Claim, 4 Drawing Sheets

DRIVER CIRCUIT FOR USE IN PIN ELECTRONICS CARD

TECHNICAL FIELD

The present invention relates to a driver circuit for switching an output voltage at an output terminal by using a diode bridge, and in particular to a driver circuit suitable for use in a pin electronics card.

BACKGROUND ART

The pin electronics card is a printed circuit board included in a test head portion of an LSI tester. On this printed circuit board, a driver circuit for supplying a signal directly to a DUT (device under test) and a comparator for receiving a signal directly from the DUT are formed.

Since a high throughput is required of the LSI tester, a driver circuit for pin electronics card is required to switch the output voltage at high speed. In the conventional driver circuit for pin electronics card, therefore, the output voltage at the output terminal is switched at high speed by using a diode bridge.

An example of a driver circuit using a diode bridge that can be used for a pin electronics card will now be described with reference to FIG. 3.

A driver circuit shown in FIG. 3 includes first and second diode bridges 1 and 2 in order to switch an output voltage at an output terminal 3 between a high level voltage (VH) and a low level voltage (VL).

The first diode bridge 1 includes four diodes $D_1$ to $D_4$. The diodes $D_1$ and $D_2$ are connected in series. The diodes $D_3$ and $D_4$ are also connected in series. And the diodes $D_1$ and $D_2$ and the diodes $D_3$ and $D_4$ are connected in parallel.

In addition, a first transistor $Q_1$ is provided between a node $N_{1a}$ between the diodes $D_1$ and $D_3$ and a high voltage source 4. A second transistor $Q_2$ is provided between a node $N_{1b}$ between the diodes $D_2$ and $D_4$ and a low voltage source 5. A node $N_{1c}$ between the diodes $D_3$ and $D_4$ is connected to the output terminal 3.

An analog buffer 6 having high input impedance and low output impedance is connected to the output terminal 3. By connecting the analog buffer 6, an abruptly changing voltage waveform can be output to an external circuit (such as a DUT) without being affected by the external circuit.

In addition, stray capacitance C is formed between the output terminal 3 and a common potential.

A node $N_{1d}$ is provided between the diode $D_1$ and the diode $D_2$. A transistor $Q_5$ is connected between the node $N_{1d}$ and the high voltage source 4, and a transistor $Q_6$ is connected between the node $N_{1d}$ and the low voltage source 5.

A second diode bridge 2 includes four diodes $D_5$ to $D_8$. The diodes $D_5$ and $D_6$ are connected in series. The diodes $D_7$ and $D_8$ are also connected in series. And the diodes $D_5$ and $D_6$ and the diodes $D_7$ and $D_8$ are connected in parallel.

In addition, a third transistor $Q_3$ is provided between a node $N_{2a}$ between the diodes $D_5$ and $D_7$ and the high voltage source 4. A fourth transistor $Q_4$ is provided between a node $N_{2b}$ between the diodes $D_6$ and $D_8$ and the low voltage source 5. A node $N_{2c}$ between the diodes $D_7$ and $D_8$ is connected to the output terminal 3.

A node $N_{2d}$ is provided between the diode $D_5$ and the diode $D_6$. A transistor $Q_7$ is connected between the node $N_{2d}$ and the high voltage source 4, and a transistor $Q_8$ is connected between the node $N_{2d}$ and the low voltage source 5.

If in such a circuit configuration the transistors $Q_1$ and $Q_2$ are in the on-state (conduction state between the source and node) and the transistors $Q_3$ and $Q_4$ are in the off-state (non-conduction state between the source and node), then an output voltage (Vout) becomes the high level voltage (VH). On the other hand, if the transistors $Q_1$ and $Q_2$ are in the off-state and the transistors $Q_3$ and $Q_4$ are in the on-state, then the output voltage (Vout) becomes the low level voltage (VL; VL<VH).

The on/off states of the transistors $Q_1$ to $Q_4$ are controlled respectively individually by control signals that are respectively applied from control signal sources *PH, PH, *PL and PL. Each of the control signals assumes a value of either the H level or the L level, and has a signal waveform of a pulse form.

Table 1 shows a logic table of the driver circuit.

TABLE 1

| Input logic | Transist or $Q_1$ | Transist or $Q_2$ | Transist or $Q_3$ | Transist or $Q_4$ | Output potential |
|---|---|---|---|---|---|
| *PH: L<br>PH: H<br>*PL: H<br>PL: L | ON | ON | OFF | OFF | VH |
| *PH: H<br>PH: L<br>*PL: L<br>PL: H | OFF | OFF | ON | ON | VL |

Operation of switching the output voltage at the output terminal from the low level to the high level will now be described.

First, when switching the output voltage (Vout) from the low level (VL) to the high level (VH), the transistors $Q_1$ and $Q_2$ are switched from the off-state to the on-state and the transistors $Q_3$ and $Q_4$ are switched from the on-state to the off-state.

As a result, a current from a constant current source $I_{20}$ flows to the stray capacitance C through the transistor $Q_1$, the node $N_{1a}$, the diode $D_3$, and the node $N_{1c}$, as shown in FIG. 3. This current is referred to as first transition current $I_{2b}$.

The value of the first transition current $I_{2b}$ is indicated by a charging current ($\Delta I_{cc}$) supplied to the stray capacitance C. The maximum current does not exceed the stationary current $I_{20}$.

Since the value of the first transition current $I_{2b}$ flows to the stray capacitance C, the stray capacitance C is charged. As a result of this charging, the output voltage (Vout) at the output terminal 3 rises from the low level (VL) to the high level (VH), and it is switched.

If the first transition current $I_{2b}$ flows through the diode $D_3$ in the first diode bridge 1, then no current flows through the diodes $D_1$ and $D_4$. In order to balance the first diode bridge 1, therefore, a first balance current $I_{2a}$ from the transistor $Q_5$ flows through the diode $D_2$.

In other words, since the charging current ($\Delta I_{cc}$)(the first transition current $I_{2b}$) flows through the diode $D_3$, the first balance current $I_{2a}$ flows through the diode $D_2$, which is disposed in a position opposed to that of the diode $D_3$ (i.e., which is not connected directly to the diode $D_3$) in order to balance the first diode bridge 1.

Thereafter, the first balance current $I_{2a}$ flows from the diode $D_2$ to the constant current source $I_{20}$ via the transistor $Q_2$.

The first balance current $I^{2a}$ exhibits a value equal to that of the first transition current $I_{2b}$. Its maximum current does not exceed the stationary current $I_{20}$.

When the stray capacitance C is charged. up to the voltage VH and the output voltage (Vout) at the output terminal 3 has reached the high level (VH) (i.e., when a shift from the transition state to the stationary state is conducted), supply of the first transition current $I_{2b}$ to the stray capacitance C is finished, and the stationary current $I_{20}$ begins to flow instead of the first transition current $I^{2b}$ as shown in FIG. 4. The stationary current $I_{20}$ flows from a constant current source $I_{20}$ on the high voltage source 4 side to a constant current source $I_{20}$ on the low voltage source 5 side via the transistor $Q_1$, the first diode bridge 1 and the transistor $Q_2$.

And since the flow of the first transition current $I_{2b}$ is finished, the flow of the first balance current $I_{2a}$ that has flown through the diode $D_2$ is also finished.

In a stationary state obtained after the output voltage (Vout) at the output terminal has been switched from the low level (VL) to the high level (VH), the stationary current $I_{20}$ flows from a constant current source $I_{20}$ on the high voltage source 4 side to a constant current source $I_{20}$ on the low voltage source 5 side via the transistor $Q_1$, the first diode bridge 1 and the transistor $Q_2$.

At the node $N_{1a}$ in the first diode bridge 1, the stationary current $I_{20}$ is divided into a current that flows through the diode $D_1$ and a current that flows through the diode $D_3$. And the current that flows through the diode $D_1$ and the diode $D_2$ and the current that flows through the diode $D_3$ and the diode $D_4$ join at the node $N_{1b}$, and a resultant current flows to the transistor $Q_2$.

Operation of switching the output voltage at the output terminal from the high level to the low level will now be described.

When switching the output voltage (Vout) from the high level (VH) to the low level (VL), the transistors $Q_1$ and $Q_2$ are switched from the on-state to the off-state and the transistors $Q_3$ and $Q_4$ are switched from the off-state to the on-state.

As a result, a discharging current from the stray capacitance C flows to the constant current source $I_{20}$ of the low voltage source 5 side via the node $N_{2c}$, the diode $D_8$, the node $N_{2b}$ and the transistor $Q_4$ in the cited order as shown in FIG. 3. This discharging current is referred to as second transition current $I_{2d}$.

The transistors $Q_1$ and $Q_2$ are turned off, and the transistors $Q_3$ and $Q_4$ are turned on. Since the discharging current (second transition current $I_{2d}$) flows from the stray capacitance C to the low voltage source 5 side, the output voltage (Vout) at the output terminal 3 falls from the high level (VH) to the low level (VL) and it is switched.

If the second transition current $I_{2d}$ flows through the diode $D_8$ in the second diode bridge 2, then a second balance current $I_{2c}$ from the transistor $Q_3$ flows through the diode $D_5$ in order to balance the second diode bridge 2.

In other words, since the discharging current flows through the diode $D_8$, the second balance current $I_{2c}$ flows through the diode $D_5$, which is disposed in a position opposed to that of the diode $D_8$ (i.e., which is not connected directly to the diode $D_8$), in order to balance the second diode bridge 2.

Thereafter, the second balance current $I_{2c}$ flows from the diode $D_5$ to the low voltage source 5 via the transistor $Q_8$. The second balance current $I_{2c}$ is equal in value to the second transition current $I_{2d}$.

When discharging from the stray capacitance C is finished and the output voltage (Vout) at the output terminal 3 has reached the low level (VL) (i.e., when a shift from the transition state to the stationary state is conducted), flow of the second transition current $I_{2d}$ is finished.

Therefore, the second balance current $I_{2c}$, which has flown through the diode $D_5$, is also finished. Instead of the second balance current $I_{2c}$, a stationary current $I_{20}$ begins to flow through the transistor $Q_4$ via the transistor $Q_3$ and the second diode bridge 2 as shown in FIG. 4.

At the node $N_{2a}$ in the second diode bridge 2, the stationary current $I_{20}$ is divided into a current that flows through the diode $D_5$ and a current that flows through the diode $D_7$. And the current that flows through the diode $D_5$ and the diode $D_6$ and the current that flows through the diode $D_7$ and the diode $D_8$ join at the node $N_{2b}$, and a resultant current flows to the transistor $Q_4$.

In a driver circuit for pin electronics card having such a configuration, the output voltage (Vout) is switched from the low level (VL) to the high level (VH), and the stationary current continues to flow even after the stationary state has been reached. In contrast, the output voltage (Vout) is switched from the high level (VH) to the low level (VL), and the stationary current continues to flow even after the stationary state has been reached.

Therefore, the driver circuit shown in FIG. 3 has a problem that power dissipation in the stationary state does not become small.

As a solution for this problem, it is considered to decrease the stationary current $I_{20}$.

However, the slew rate (switching speed) conducted when switching the level of the output voltage is determined by the stray capacitance C and the charging current ($\Delta I_{cc}$). If the stationary current $I_{20}$ is decreased in order to decrease the power dissipation, then, a problem arises in that the slew rate falls.

Thus in the driver circuit shown in FIG. 3, it is difficult to achieve both the reduction of the power dissipation and the maintenance of the high slew rate.

Especially, when the driver circuit is used for the pin electronics card, it has been a problem to output a voltage waveform that is steeper in the rising edge and the falling edge to the DUT. In other words, it has been demanded to provide a technique for making the slew rate of level switching in the output voltage at the output terminal of the driver circuit faster.

SUMMARY OF THE INVENTION

The present invention has been made in order to solve the problem. It becomes possible to make the slew rate obtained when switching the level of the output voltage higher and reduce the power dissipation in the driver circuit without lowering the slew rate. An object of the present invention is to provide a driver circuit suitable for use in pin electronics cards.

The present invention provides a driver circuit including first and second diode bridges, wherein when switching an output voltage at an output terminal from a low level to a high level, a first transition current is let flow from a high voltage source to stray capacitance via a diode included in the first diode bridge, and a first balance current is let flow from the high voltage source to a low voltage source via a diode located so as to be opposed to the diode of the first diode bridge, and when switching the output voltage from the high level to the low level, a second transition current is let flow from the stray capacitance to the low voltage source via a diode included in the second diode bridge, and a second balance current is let flow from the high voltage source to the low voltage source via a diode located so as to be opposed to the diode of the second diode bridge, the driver circuit includes: a first current mirror circuit for letting flow the first transition current obtained by adding a product of a value of the first balance current and a predetermined multiplier to a first stationary current value, from the high voltage source to the first diode bridge; and a second current mirror circuit for letting flow the second transition current obtained by adding a product of a value of the second balance current and a predetermined multiplier to a second stationary current value, from the second diode bridge to the low voltage source.

Thus, in the driver circuit according to the present invention, the first transition current that flows when switching the output voltage from the low level to the high level can be made equal to the product of the value of the first balance current and a predetermined multiplier, by providing the first current mirror circuit.

As a result, the current value can be increased as compared with the first transition current in the driver circuit shown in FIG. 3. Therefore, the slew rate determined by the charging current and the stray capacitance can be made faster.

In addition, if the slew rate is set equal to the switching speed in the conventional technique, the current value can be decreased as compared with the stationary current $I_{20}$ in the driver circuit shown in FIG. 4.

Therefore, the power dissipation in the driver circuit at the time of stationary state can be reduced.

Since the reduction of the power dissipation is not brought about by reduction of the first transition current, the power dissipation in the driver circuit at the time of stationary state can be reduced, without lowering the slew rate when switching the output voltage.

According to the present invention, the second transition current that flows when switching the output voltage from the high level to the low level can be made equal to the product of the value of the second balance current and a predetermined multiplier, by providing the second current mirror circuit.

As a result, the current value can be increased as compared with the second transition current in the driver circuit shown in FIG. 3. Therefore, since the charging current, which is the second transition current, is increased as compared with the conventional technique, the slew rate, which is the switching speed of the output voltage, can be made further faster.

In addition, if the conventional slew rate is used in the voltage waveform to be output to an external circuit, the current value can be decreased as compared with the stationary current $I_{20}$ in the driver circuit shown in FIG. 4. Therefore, the power dissipation at the time of stationary state can be reduced.

Since the reduction of the power dissipation is not brought about by reduction of the second transition current, the power dissipation in the driver circuit in the stationary state can be reduced, without lowering the slew rate when switching the output voltage.

DETAILED DESCRIPTION OF THE INVENTION

An embodiment of the present invention will now be described with reference to FIG. 1.

Figure 1:
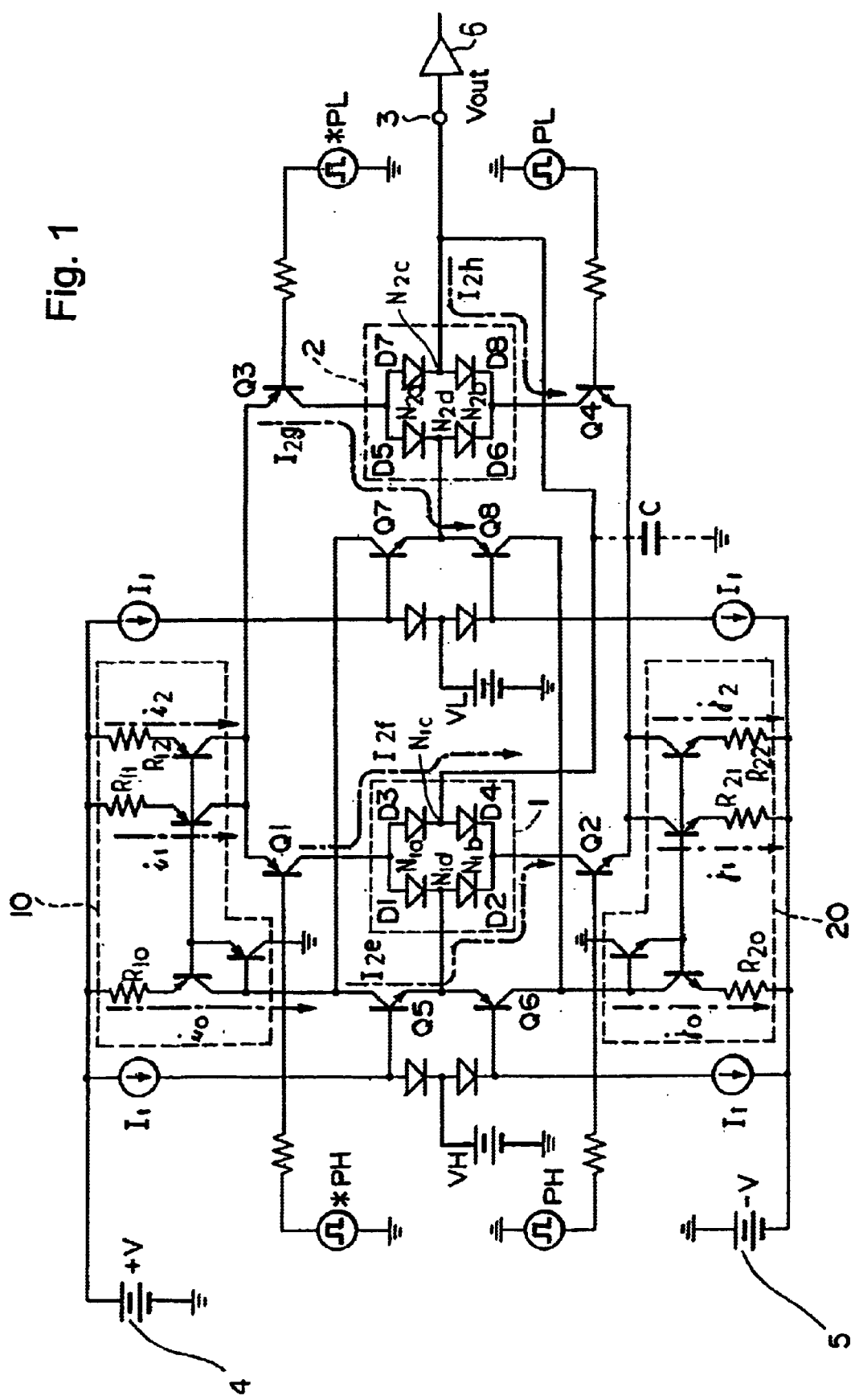
FIG. 1 is a circuit diagram of a principal part of a driver circuit according to an embodiment of the present invention.

FIG. 1 is a circuit diagram of a principal part of a driver circuit according to an embodiment. As shown in FIG. 1, the driver circuit of the present embodiment has a configuration similar to that of the driver circuit shown in FIG. 3 except that first and second current mirror circuits 10 and 20 are provided.

Figure 3:
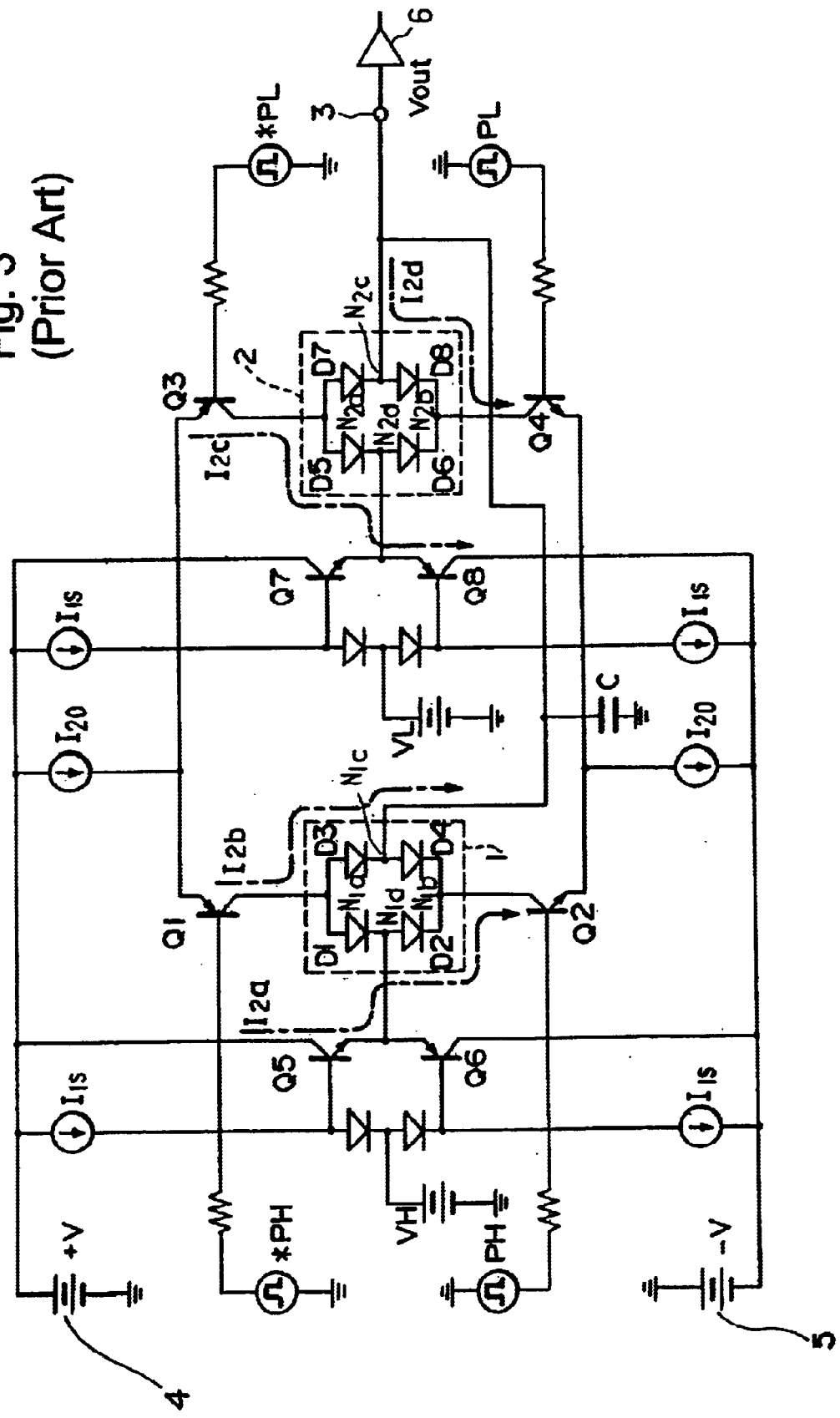
FIG. 3 is a circuit diagram of a principal part of a driver circuit according to a conventional technique.
Figure 4:
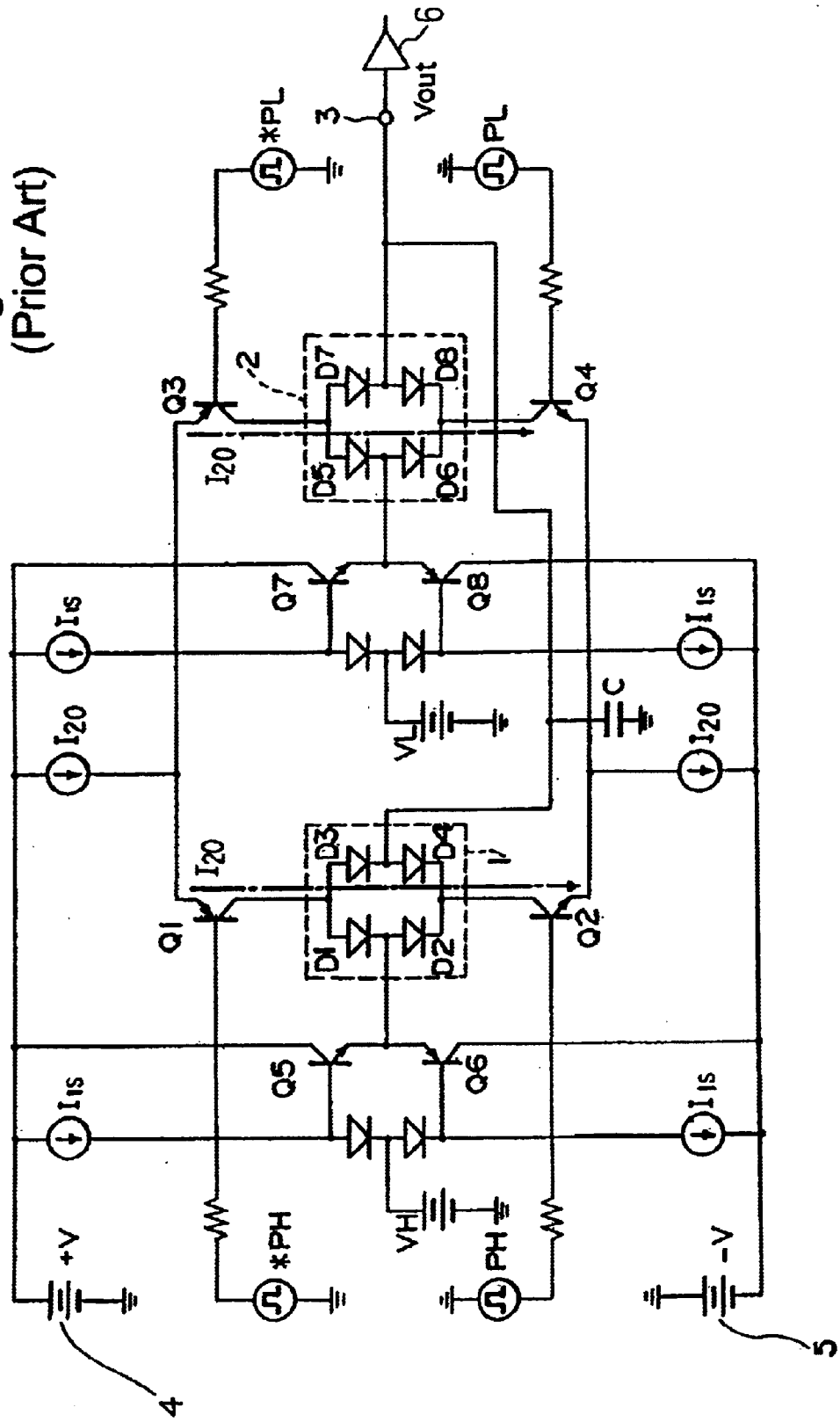
FIG. 4 is a circuit diagram of a principal part of a driver circuit according to a conventional technique.

In other words, the driver circuit of the embodiment also includes first and second diode bridges 1 and 2 in the same way as the circuit shown in FIG. 3 in order to switch the output voltage at an output terminal 3 between a high level voltage (VH) and a low level voltage (VL).

In addition, a first transistor $Q_1$ is provided between the first diode bridge 1 and a high voltage source 4, and a second transistor $Q_2$ is provided between the first. diode bridge 1 and a low voltage source 5. A node $N_{1c}$ between a diode $D_3$ and a diode $D_4$ is connected to the output terminal 3. Stray capacitance C is formed between the output terminal 3 and common potential.

A third transistor $Q_3$ is provided between the second diode bridge 2 and the high voltage source 4, and a fourth transistor $Q_4$ is provided between the second diode bridge 2 and the low voltage source 5. In addition, a node $N_{2c}$ between a diode $D_7$ and a diode $D_8$ is connected to the output terminal 3.

If the transistors $Q_1$ and $Q_2$ are in the on-state and the transistors $Q_3$ and $Q_4$ are in the off-state, then an output voltage (Vout) becomes the high level voltage (VH). On the other hand, if the transistors $Q_1$ and $Q_2$ are in the off-state and the transistors $Q_3$ and $Q_4$ are in the on-state, then the output voltage (Vout) becomes the low level voltage (VL).

A first current mirror circuit 10 is provided between the high voltage source 4 and the first diode bridge 1.

A second current mirror circuit 20 is provided between the low voltage source 5 and the second diode bridge 2.

Among them, the first current mirror circuit 10 includes a resistor $R_{10}$ through which a reference current $i_0$ flows, a resistor $R_{11}$ through which a current $i_1$ flows, and a resistor $R_{12}$ through which a current $i_2$ flows. These resistors $R_{10}$, $R_{11}$, and $R_{12}$ are connected in parallel.

The second current mirror circuit 20 includes a resistor $R_{20}$ through which a reference current $j_0$ flows, a resistor $R_{21}$ through which a current $j_1$ flows, and a resistor $R_{22}$ through which a current $j_2$ flows. These resistors $R_{20}$, $R_{21}$ and $R_{22}$ are connected in parallel.

In the first current mirror circuit 10, the current that flows through the resistor $R_{10}$ is the reference current $i_0$, and the current that flows through a composite resistor ($R_{1T}$=resistor $R_{11}$+resistor $R_{12}$) is referred to as mirror current ($i_{12}=i_1+i_2$). In the second current mirror circuit 20, the current that flows through the resistor $R_{20}$ is the reference current $j_0$, and the current that flows through a composite resistor ($R_{2T}$=resistor $R_{21}$+resistor $R_{22}$) is referred to as mirror current ($j_{22}=j_1+j_2$).

Operation of the driver circuit in a transition state (first transition state) at the time when switching the output voltage at the output terminal from the low level to the high level will now be described with reference to FIG. 1.

When switching the output voltage (Vout) from the low level (VL) to the high level (VH), the transistors $Q_1$ and $Q_2$ are switched from the off-state to the on-state and the transistors $Q_3$ and $Q_4$ are switched from the on-state to the off-state.

As a result, the mirror current $i_{12}$ (a first transition current $I_{2f}$) from the composite resistor $R_{1T}$ in the first current mirror circuit 10 flows to the stray capacitance C via the transistor $Q_1$, the node $N_{1a}$, the diode $D_3$, and the node $N_{1c}$ as shown in FIG. 1.

The value of the first transition current $I^{2f}$ is indicated by a sum of a value of a stationary current $I_{x0}$ and a value of an addition current ($2 \times I_{ch1}$). The addition current becomes a product of the first balance current $I_{2e}$ and a predetermined multiplier.

Since the first transition current $I_{2f}$ flows to the stray capacitance C, the stray capacitance C is charged. As a result of this charging, the output voltage (Vout) at the output terminal 3 rises from the low level (VL) to the high level (VH), and it is switched.

If the first transition current $I^{2f}$ flows through the diode $D_3$ in the first diode bridge 1, then a first balance current $I_{2e}$ from the transistor $Q_5$ flows through the diode $D_2$ in order to balance the first diode bridge 1.

In other words, since the charging current (the first transition current $I^{2f}$) flows through the diode $D_3$, the first balance current $I_{2e}$ flows through the diode $D_2$, which is disposed in a position opposed to that of the diode $D_3$ (i.e., which is not connected directly to the diode $D_3$), in order to balance the first diode bridge 1.

The first balance current $I_{2e}$ is added to the reference current $i_0$ in the first current mirror circuit 10. A resultant current flows from the first current mirror circuit 10 to a composite resistor $R_{2T}$ in the second current mirror circuit 20 via the diode $D_2$ and the transistor $Q_2$.

In addition, the value of the first balance current $I_{2c}$ is equal to the mirror current in the second current mirror circuit 20. The first balance current $I_{2e}$ is equal in current value to one third of the first transition current $I_{2f}$.

The relation between the first transition current and the first balance current will now be described with reference to FIG. 1.

In the first current mirror circuit 10, the composite current $i_{12}$ composed of the mirror currents $i_1$ and $i_2$ flows as the first transition current $I_{2f}$ and the mirror current in the second current mirror circuit 20 flows as the first balance current $I_{2e}$ as shown in FIG. 1.

In other words, the first transition current $I_{2f}$ is determined by the value of the composite resistor $R_{1T}$ composed of the resistor $R_{11}$ and the resistor $R_{12}$, and the first balance current $I_{2e}$ is determined by the mirror resistor in the second current mirror circuit 20.

In the relation to the first balance current $I_{2e}$, therefore, the addition current is determined on the basis of a ratio of the single resistor $R_{10}$ to the composite resistor $R_{1T}$ (the predetermined multiplier).

For example, in FIG. 1, it follows that the first balance current $I_{2e}$: the addition component of the first transition current $I_{2f}$=the composite resistor $R_{1T}$: the single resistor $R_{10}$=1:2. Therefore, it follows that (the first balance current $I_{2e}$)×2=(the addition component of the first transition current $I^{2f}$). In this case, the predetermined multiplier is 2.

The predetermined multiplier is not limited to 2. A multiplier other than 2, such as, for example, 3, may also be used.

If the predetermined multiplier is 3, then a sum current obtained by adding an addition current that is three times the first balance current to the stationary current flows as the first transition current. Therefore, the slew rate of the rising edge in a voltage waveform supplied from the output terminal to an external circuit can be made faster.

In the case where the slew rate is set equal to a conventional speed, the first balance current can be made one fourth or less of the first transition current.

Since in the stationary state the mirror current in the first current mirror circuit 10 can be reduced to one fourth, the power dissipation in the driver circuit can be reduced.

In FIG. 1, the predetermined multiplier is determined on the basis of resistance values of resistor elements. However, the basis of the predetermined multiplier is not limited to resistance values of resistor elements. For example, the predetermined multiplier may be determined on the basis of internal resistance of electronic components such as transistors.

By thus providing such a current mirror circuit in the driver circuit, a transition current having a value equal to the product of the reference current (balance current) and the predetermined multiplier can be obtained. As compared with the driver circuit shown in FIG. 3, therefore, a larger charging current can be let flow.

Therefore, the voltage across the stray capacitance C reaches the voltage VH in a moment. As a result, the slew rate obtained at the time when the level of the output voltage at the output terminal is switched can be made faster. In other words, a voltage waveform that is steeper in rising than that in the conventional technique can be obtained.

In the case where a voltage waveform is output from the output terminal to an external circuit by using the conventional slew rate, a value of the first transition current enough to satisfy the slew rate needs only to be set. Therefore, the first balance current and the mirror current can be decreased according to the resistance ratio in the current mirror circuit.

Owing to the decrease in the mirror current, power dissipation in each of components included in the driver circuit can be suppressed and the current supplied from the high voltage source 4 can be decreased.

Therefore, the power supply current supplied to the driver circuit and the power dissipation within the driver circuit can be decreased.

The decrease of power dissipation in the driver circuit is based on the decrease of the first balance current and the decrease of the mirror current at the time of stationary operation, but it is not based on the decrease of the first transition current. Therefore, it is possible to reduce the power dissipation in the driver circuit while maintaining the increased slew rate.

Also when the output voltage at the output terminal is switched from the high level to the low level, similar (symmetrical) operation is conducted and consequently description thereof will be omitted.

Operation of the driver circuit in the stationary state will now be described with reference to FIG. 2.

In the stationary state, the current that flows through the resistor $R_{10}$ in the first current mirror circuit 10 is the reference current $i_0$. The current that flows through the composite resistor $R_{1T}$ is the current $i_{12}$ (the stationary current $I_{x0}$) which is the product of the reference current $i_0$ and the predetermined multiplier.

On the other hand, in the second current mirror circuit 20 as well, the current that flows through the resistor $R_{20}$ is the reference current $j_0$, and the current that flows through the composite resistor $R_{2T}$ is a current $j_{12}$ (stationary current $I_{x2}$), which is equal to the product of the reference current $j_0$ and a predetermined multiplier.

In the stationary state, therefore, the first transition current and the stationary current $I_2$ can be decreased as compared with those in the conventional driver circuit. In the stationary state, therefore, the power dissipation in the driver circuit can be reduced.

Figure 2:
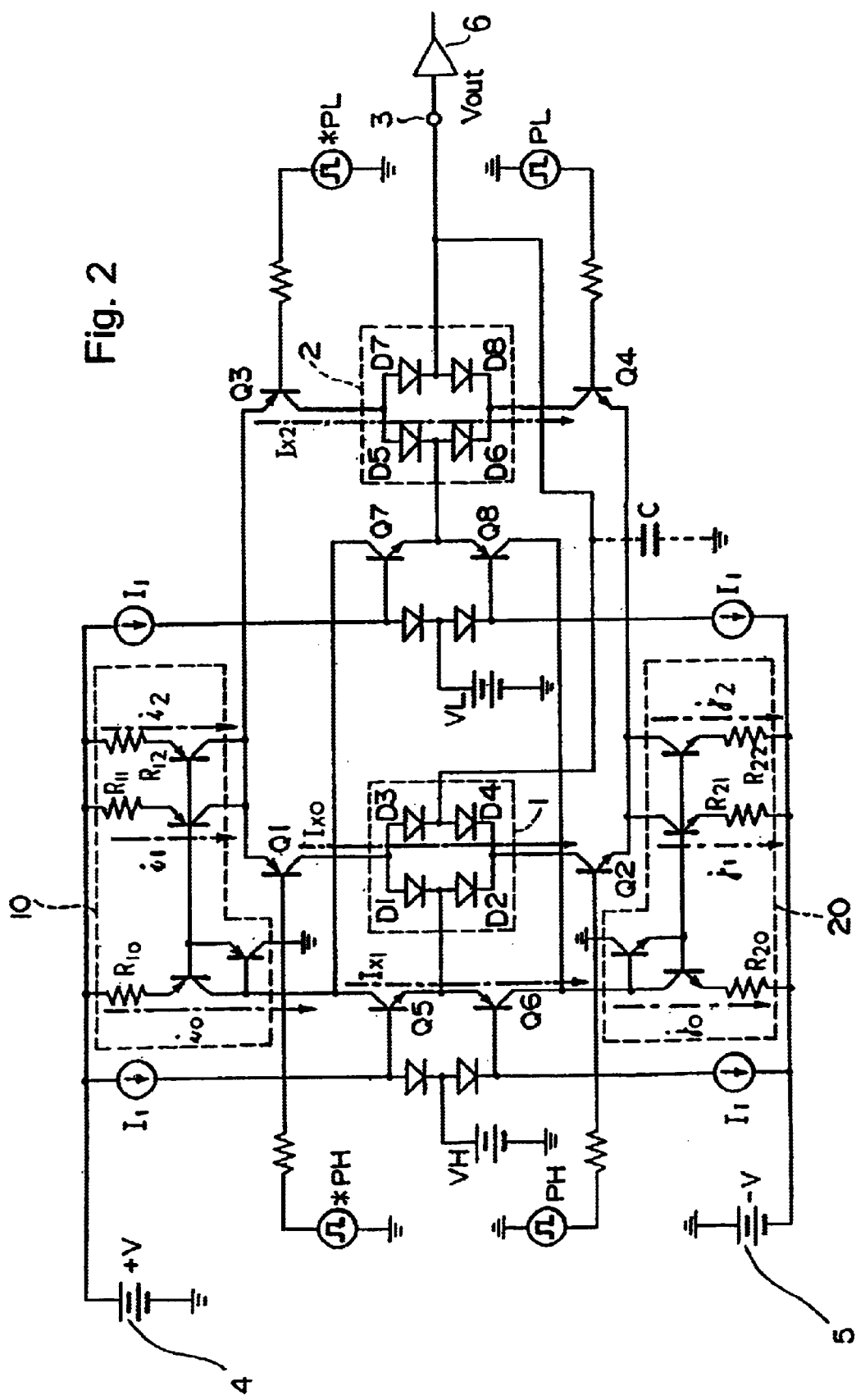
FIG. 2 is a circuit diagram of a principal part of a driver circuit according to an embodiment of the present invention.

In the first and second current mirror circuits 10 and 20 shown in FIGS. 1 and 2, each of the resistor $R_{10}$, the composite resistor $R_{1T}$, the resistor $R_{20}$, and the composite resistor $R_{2T}$ has one resistor or two resistors. However, the number of resistors is not limited to one or two, but two or more resistors may be connected in series or in parallel.

According to the present invention, the mirror current in the stationary state can be reduced as compared with the conventional stationary current $I_2$ by providing the first current mirror circuit and the second current mirror circuit. Therefore, the power dissipation in the driver circuit at the time of the transition state and the stationary state can be reduced.

Since the reduction of the power dissipation is implemented without reducing the first and second transition currents, the increased slew rate at the time when the level of the output voltage is switched can be maintained. Therefore, the power dissipation within the driver circuit at the time of transition state and the stationary state can be reduced without lowering the slew rate.

As heretofore described, the driver circuit according to the present invention can be used effectively as a driver circuit for pin electronics card in a test head portion of an LSI tester.

What is claimed is:

1. A driver circuit comprising:

first and second diode bridges, wherein when switching an output voltage at an output terminal from a low level to a high level, a first transition current is let flow from a high voltage source to stray capacitance via a diode included in the first diode bridge, and a first balance current is let flow from the high voltage source to a low voltage source via a diode located so as to be opposed to the diode of the first diode bridge, and when switching the output voltage from the high level to the low level, a second transition current is let flow from the stray capacitance to the low voltage source via a diode included in the second diode bridge, and a second balance current is let flow from the high voltage source to the low voltage source via a diode located so as to be opposed to the diode of the second diode bridge, and the driver circuit comprises:

a first current mirror circuit for letting flow the first transition current obtained by adding a product of a value of the first balance current and a predetermined multiplier to a first stationary current value, from the high voltage source to the first diode bridge; and a second current mirror circuit for letting flow the second transition current obtained by adding a product of a value of the second balance current and a predetermined multiplier to a second stationary current value, from the second diode bridge to the low voltage source.

* * * * *